(12) United States Patent
Song et al.

(10) Patent No.: US 11,973,493 B2
(45) Date of Patent: Apr. 30, 2024

(54) VOLTAGE CLAMPING CIRCUIT FOR SOLID STATE CIRCUIT BREAKER

(71) Applicant: ABB Schweiz Ag, Baden (CH)

(72) Inventors: Xiaoqing Song, Apex, NC (US); Yu Du, Apex, NC (US)

(73) Assignee: ABB SCHWEIZ AG, Baden (CH)

( * ) Notice: Subject to any disclaimer, the term of this patent is extended or adjusted under 35 U.S.C. 154(b) by 406 days.

(21) Appl. No.: 17/326,914

(22) Filed: May 21, 2021

(65) Prior Publication Data

US 2021/0288636 A1    Sep. 16, 2021

Related U.S. Application Data

(63) Continuation of application No. PCT/US2019/062622, filed on Nov. 21, 2019.

(60) Provisional application No. 62/770,306, filed on Nov. 21, 2018.

(51) Int. Cl.
*H01C 7/12*     (2006.01)
*H03K 17/082*   (2006.01)

(52) U.S. Cl.
CPC ............ *H03K 17/082* (2013.01); *H01C 7/12* (2013.01)

(58) Field of Classification Search
CPC .......... H01C 7/12; H02H 7/222; H02H 7/008; H03K 17/08144; H03K 17/08146; H03H 3/08
USPC ...................................................... 361/2–13
See application file for complete search history.

(56) References Cited

U.S. PATENT DOCUMENTS

| | | | | |
|---|---|---|---|---|
| 3,947,726 A | * | 3/1976 | DeCecco | H03K 17/08144 361/91.8 |
| 4,470,005 A | * | 9/1984 | Gyugyi | H02J 3/1864 361/13 |
| 4,631,621 A | | 12/1986 | Howell | |
| 5,233,495 A | * | 8/1993 | De Palma | H03K 17/08144 361/13 |
| 2002/0159212 A1 | | 10/2002 | Oughton, Jr. | |
| 2012/0200967 A1 | | 8/2012 | Mikolajczak | |
| 2013/0021708 A1 | | 1/2013 | Demetriades et al. | |
| 2015/0002977 A1 | * | 1/2015 | Dupraz | H01H 71/10 361/115 |

(Continued)

FOREIGN PATENT DOCUMENTS

WO    2011098145    8/2011
WO    2017024577    2/2017

OTHER PUBLICATIONS

International Search Report and Written Opinion, PCT Appln. Serial No. PCT/US19/62622, dated Apr. 22, 2020, 11 pgs.

*Primary Examiner* — Danny Nguyen
(74) *Attorney, Agent, or Firm* — Greenberg Traurig, LLP

(57) ABSTRACT

Unique systems, methods, techniques and apparatuses of solid state circuit breaker protection are disclosed. One exemplary embodiment is a solid state circuit breaker comprising a primary switching device including a first terminal and a second terminal and a voltage clamping circuit coupled in parallel with the primary switching device. The voltage clamping circuit includes a metal-oxide varistor (MOV) coupled in series between the first terminal and an auxiliary semiconductor device, the auxiliary semiconductor device being arranged so as to selectively couple the MOV with the second terminal, and a bypass circuit coupled between the first terminal and the auxiliary semiconductor device.

20 Claims, 5 Drawing Sheets

(56) References Cited

U.S. PATENT DOCUMENTS

2015/0365086 A1* 12/2015 Focia .................. H03K 17/72
                                                    327/438
2016/0322809 A1    11/2016 Wang et al.
2018/0019583 A1*   1/2018 Dupraz ................. H02H 1/04
2018/0240575 A1    8/2018 To et al.
2018/0331534 A1    11/2018 Nojima

* cited by examiner

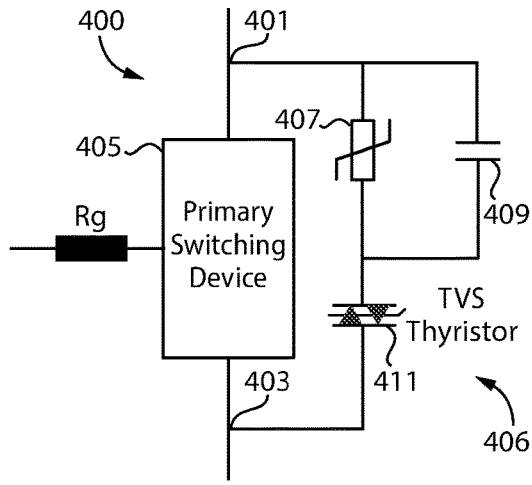
Fig. 4A
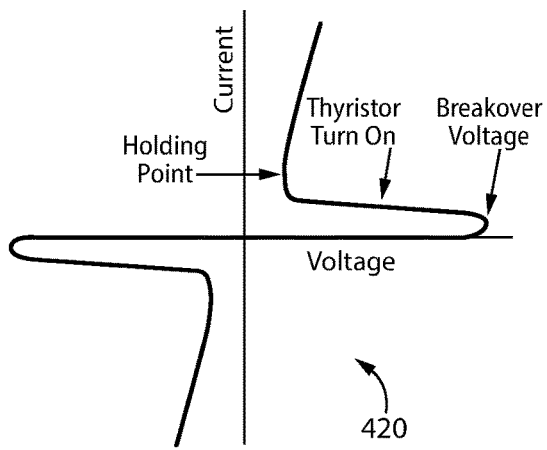
Prior Art
Fig. 4B
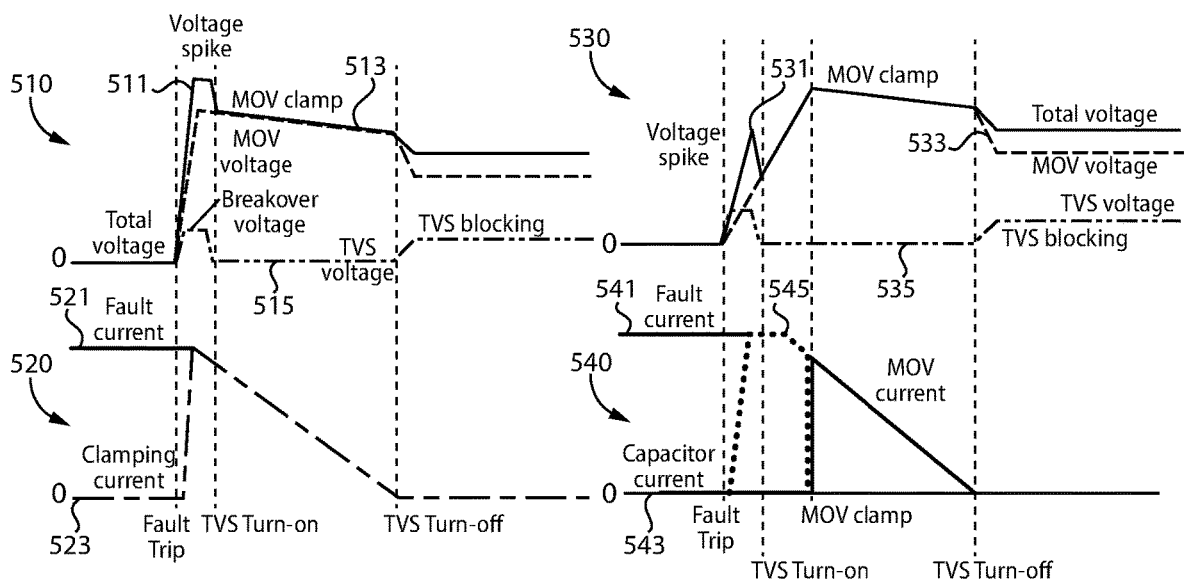
Prior Art
Fig. 5A
Fig. 5B

VOLTAGE CLAMPING CIRCUIT FOR SOLID STATE CIRCUIT BREAKER

CROSS REFERENCE TO RELATED APPLICATION

This application is a continuation of PCT Application Serial No. PCT/US19/62622 filed Nov. 21, 2019 which claims priority under 35 U.S.C. 119(e) from U.S. Provisional patent application No. 62/770,306 filed on Nov. 21, 2018, entitled "VOLTAGE CLAMPING CIRCUIT FOR SOLID STATE CIRCUIT BREAKER" which are hereby incorporated by reference in their entirety.

BACKGROUND

The present disclosure relates generally to solid state circuit breaker (SSCB) protection. Metal-oxide varistors (MOVs) are widely used to protect the primary switching device in SSCBs from overvoltage damage and to absorb the excess energy in the line impedance during overcurrent fault interruption. When choosing the right MOV in terms of the operation voltage, there are two requirements. First, the peak clamping voltage of the MOV should be lower than the breakdown voltage of the primary switching device. Second, the leakage current of the MOV should be low enough to ensure the resulting power loss is within the power dissipation capability of the MOV. These requirements mandate a small operation region for the MOV when the source voltage (or system voltage) is close to the breakdown voltage of the primary switching device, as shown in FIG. 1 where the MOV operating region 105 is bounded by the breakdown voltage 101 of the primary switching device and the source voltage 103 of the power flowing through the SSCB during normal operation. Existing SSCBs suffer from a number of shortcomings and disadvantages. In certain conventional designs, a one-time voltage margin is added to the power-source voltage for the power semiconductor switches due to large voltage operation region of MOV's, which reduces the voltage utilization rate and increases the cost of the switches. In view of these and other shortcomings in the art, there is a significant need for the unique apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY OF THE DISCLOSURE

Exemplary embodiments of the disclosure include unique systems, methods, techniques and apparatuses for solid state circuit breaker protection. Further embodiments, forms, objects, features, advantages, aspects and benefits of the disclosure shall become apparent from the following description and drawings.

BRIEF DESCRIPTION OF THE DRAWINGS

FIG. 4A is a circuit diagram illustrating an exemplary solid state circuit breaker including a transient voltage suppression (TVS) thyristor-based voltage clamping circuit.

FIG. 4B is a graph illustrating electrical characteristics of a TVS thyristor such as the TVS thyristor of the exemplary solid state circuit breaker of FIG. 4A.

FIG. 5A is graphs illustrating electrical characteristics of a solid state circuit breaker without the exemplary bypass circuit of the solid state circuit breaker of FIG. 4A.

FIGS. 5B-6B are graphs illustrating electrical characteristics of the exemplary solid state circuit breaker of FIG. 4A.

DETAILED DESCRIPTION OF ILLUSTRATIVE EMBODIMENTS

Figure 1:
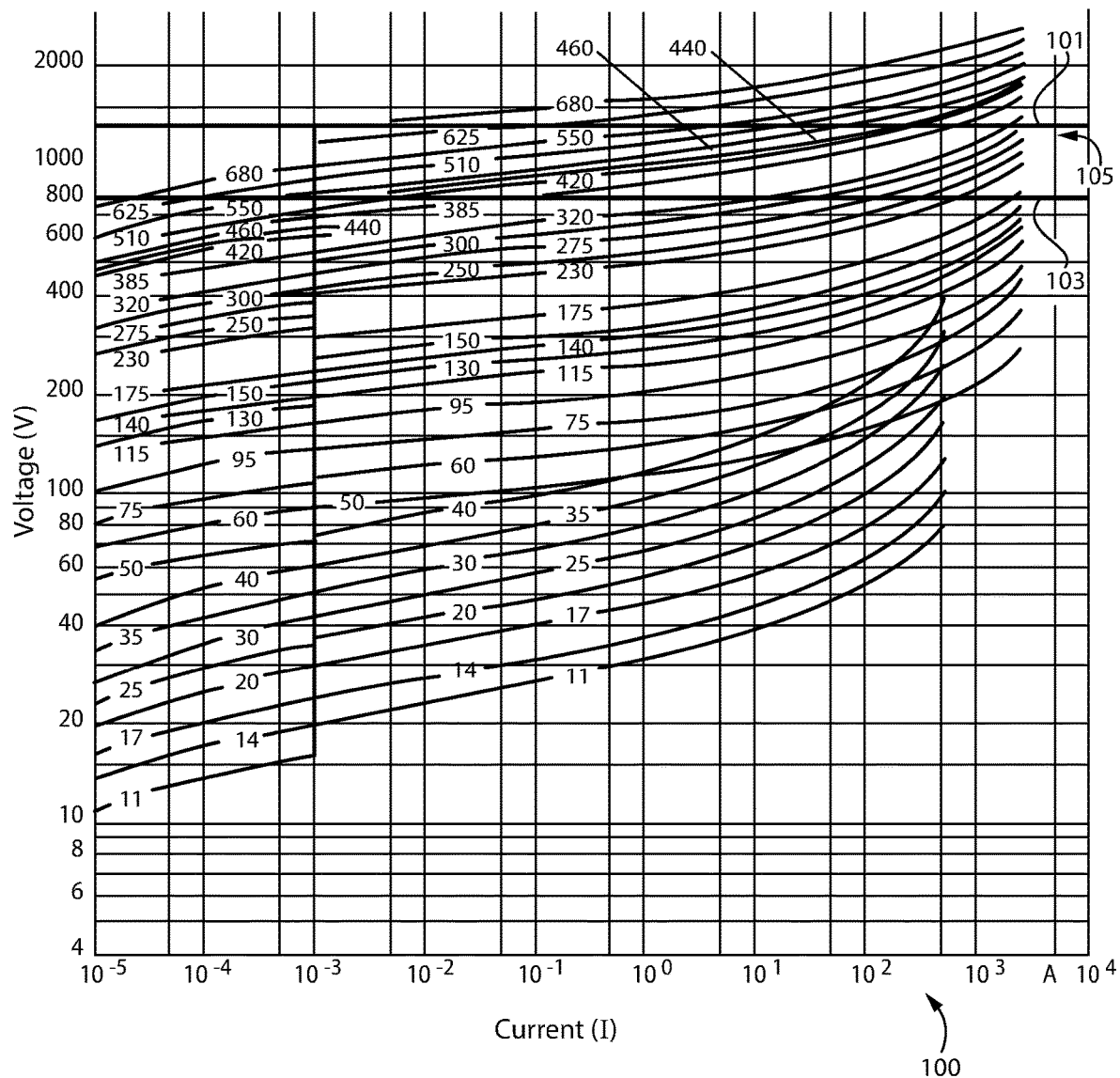
FIG. 1 is a graph illustrating electrical characteristics of a metal-oxide varistor.
Figure 2:
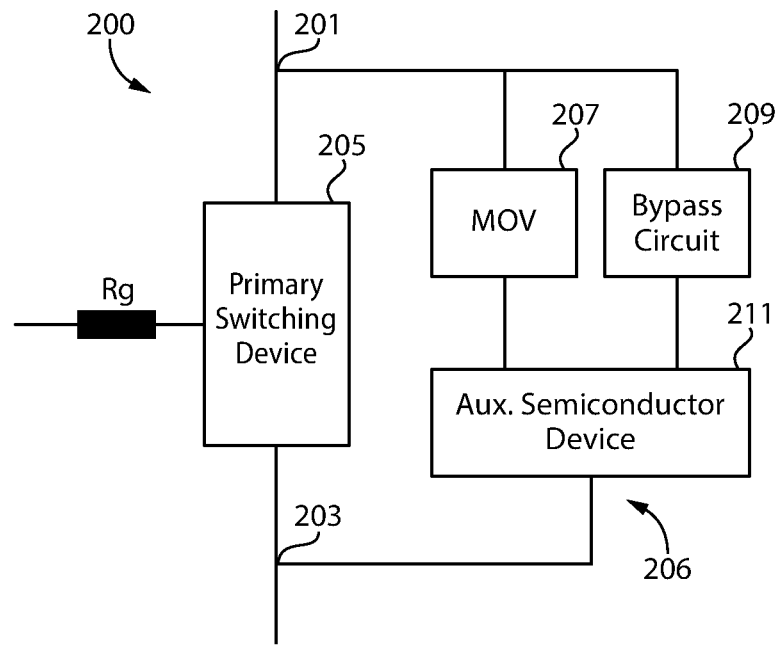
FIG. 2 is a circuit diagram illustrating an exemplary solid state circuit breaker.

With reference to FIG. 2, there is illustrated an exemplary solid state circuit breaker (SSCB) 200 structured to control the flow of a current through a power system into which SSCB 200 is incorporated. It shall be appreciated that SSCB 200 may be implemented in a variety of applications, including direct current (DC) power systems, low voltage distribution systems, medium voltage distribution systems, and high voltage transmission systems, to name but a few examples.

SSCB 200 includes a primary switching device 205 including a first terminal 201 and a second terminal 203. During normal operation of the power system into which SSCB 200 is incorporated, primary switching device 205 is closed, also known as turned on, allowing a current to flow between terminals 201 and 203. In response to a fault condition, primary switching device 205 is opened, also known as turned off, interrupting the flow of fault current through primary switching device 205. A fault condition may include an overcurrent condition where the fault current exceeds a current threshold, to name but one example. Primary switching device 205 responds to the fault condition by interrupting the fault current to protect the power system.

Primary switching device 205 includes one or more semiconductor switches, such as insulated-gate bipolar transistors (IGBTs), bipolar junction transistors (BJTs), metal-oxide semiconductor field effect transistors (MOSFETs), gate turn-off thyristors (GTOs), MOS-controlled thyristors (MCTs), integrated gate-commutated thyristors (IGCTs), silicon carbide (SiC) switches, gallium nitride (GaN) switches, or any other type of semiconductor switch structured to control the flow of current. The semiconductor switch or switches of primary switching device 205 may be coupled in series, parallel, anti-series, anti-parallel, or a combination thereof.

SSCB 200 includes a voltage clamping circuit 206 structured to protect primary switching device 205 during a fault condition. Voltage clamping circuit 206 includes a metal-oxide varistor (MOV) 207, an auxiliary semiconductor device 211, and a bypass circuit 209. MOV 207 and auxiliary semiconductor device 211 are coupled in series between terminals 201 and 203 such that MOV 207 and auxiliary semiconductor device 211 are coupled in parallel with switching device 205. Bypass circuit 209 is coupled to auxiliary semiconductor device 211 and coupled in parallel with MOV 207.

MOV 207 is structured to dissipate fault current by converting the fault current into heat. As fault current continues to flow through bypass circuit 209, a voltage across MOV 207, also known as the MOV 207 voltage, increases until the voltage reaches a voltage where MOV 207 is structured to clamp the voltage preventing the MOV 207 voltage from increasing further, also known as the MOV 207 clamping voltage. Auxiliary semiconductor device 211 is structured to control current flow through voltage clamping circuit 206. Auxiliary semiconductor device 211 may include a transient voltage suppression (TVS) thyristor, a TVS diode, an IGBT, or a MOSFET, to name but a few examples. Device 211 may also include a control circuit structured to operate a semiconductor switch of device 211 using current received from bypass circuit 209.

During normal operation of the power system, auxiliary semiconductor device 211 is turned off, thereby reducing MOV 207 leakage current and blocking a portion of the voltage across voltage clamping circuit 206. By reducing the leakage current of the MOV, voltage clamping circuit 206 is arranged to reduce thermal stress and power losses during normal operation. By blocking a portion of the voltage across voltage clamping circuit 206, auxiliary semiconductor device 211 reduces MOV 207 voltage stress.

During a fault condition, voltage clamping circuit 206 is structured to turn on auxiliary semiconductor device 211, allowing fault current to flow through MOV 207 to terminal 203. A short delay occurs between auxiliary semiconductor device 211 first receiving the fault current from bypass circuit 209 and auxiliary semiconductor device 211 turning on. For example, where auxiliary semiconductor device 211 includes a TVS thyristor, turning on auxiliary semiconductor device 211 may take a few microseconds (2-3 µs) for the device interior carrier modulation to build up. As a result of the delay, a voltage spike is generated across auxiliary semiconductor device 211.

Bypass circuit 209 is structured to allow a fault current to bypass MOV 207 and turn on auxiliary semiconductor device 211. In certain embodiments, bypass circuit 209 is structured to turn on auxiliary semiconductor device 211 without a control circuit, simplifying SSCB 200 and reducing cost. By bypassing MOV 207, voltage clamping circuit 206 is structured to delay an increase in the MOV 207 voltage such that the combination of the MOV 207 voltage and the auxiliary semiconductor device 211 voltage spike never exceeds the MOV 207 clamping voltage.

Without bypass circuit 209, fault current would be commutated from primary switching device 205 to MOV 207 and auxiliary semiconductor device 211. Auxiliary semiconductor device 211 would generate the voltage spike as it is turned on at the same time the MOV 207 voltage reaches the MOV clamping voltage, increasing the total clamping voltage across primary switching device 205. This increased total clamping voltage would require primary switching device 205 to have a higher voltage rating, thereby decreasing the voltage utilization rate of primary switching device 205.

Bypass circuit 209 may include a capacitor coupled between terminal 201 and auxiliary semiconductor device 211, to name but one example. The capacitor may be coupled to a semiconductor switch and a control circuit of auxiliary semiconductor device 211. In certain embodiments, bypass circuit 209 may include a resistor coupled to terminal 201 and a control circuit of auxiliary semiconductor device 211.

Once auxiliary semiconductor device 211 is turned on during a fault condition, the fault current commutates from bypass circuit 209 to MOV 207. It shall be appreciated that after the fault current commutates from bypass circuit 209 to MOV 207, a substantial portion of the fault begins to flow through MOV 207 instead of bypass circuit, but a portion of the fault current may continue to flow through bypass circuit. The portion of the fault current continuing to flow through bypass circuit 209 after the fault current commutates from bypass circuit 209 to MOV 207 may be less than 1% of the fault current magnitude at the time of the commutation, to give but one example. It shall be appreciated that any or all of the foregoing features of SSCB 200 may also be present in the other circuit breakers disclosed herein, such as the exemplary solid state circuit breakers illustrated in FIGS. 4A, 7, and 8.

Figure 3:
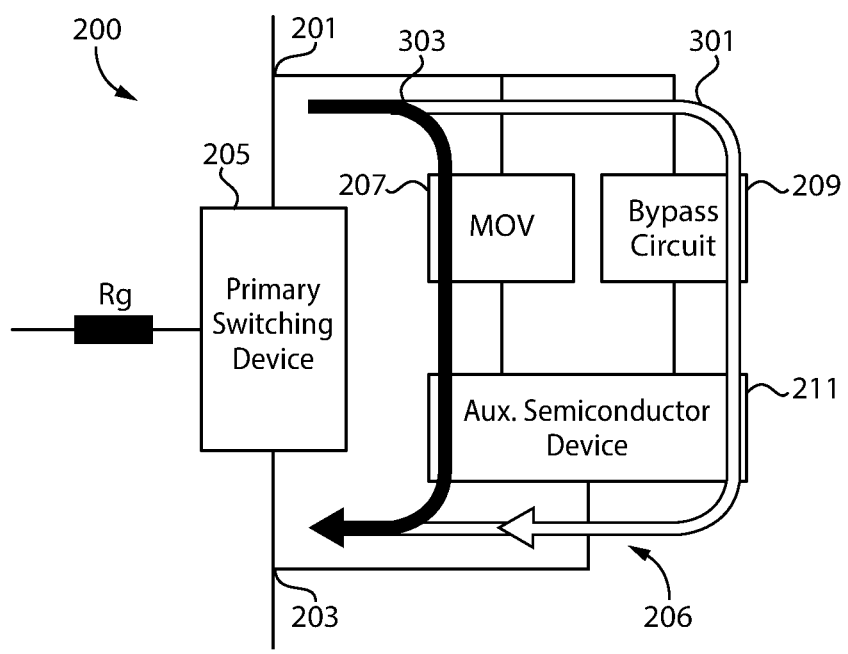
FIG. 3 is a circuit diagram illustrating current flow through the exemplary solid state circuit breaker of FIG. 2.

With reference to FIG. 3, there is illustrated current paths 301 and 303 through voltage clamping circuit 206 of SSCB 200 in FIG. 2. During a fault condition, there is a current conduction sequence in voltage clamping circuit 206. After primary switching device 205 is turned off, the fault current flows through path 301, including bypass circuit 209 and auxiliary semiconductor device 211. Using bypass circuit 209, auxiliary semiconductor device 211 will be turned on. When the MOV 207 voltage rises to the MOV 207 clamping voltage, fault current will begin to flow through path 303, commutating from bypass circuit 209 to MOV 207. When the fault current reduces to zero or substantially zero, auxiliary semiconductor device 211 is turned off so as to share the blocking voltage with MOV 207. In one example, substantially zero may be a current magnitude less than a holding current point of the auxiliary semiconductor device. Therefore, the leakage current is much smaller compared to a stand-alone MOV.

With reference to FIG. 4A, there is illustrated an exemplary SSCB 400 including a primary switching device 405 and a voltage clamping circuit 406 coupled in parallel. Primary switching device 405 includes terminals 401 and 403. Voltage clamping circuit 406 includes an MOV 407 and a TVS thyristor 411 coupled together in series between terminals 401 and 403, as well as a bypass circuit including a capacitor 409 coupled in parallel with MOV 407.

With reference to FIG. 4B, there is a graph 420 illustrating current-voltage characteristics of TVS thyristor 411. TVS thyristor 411 is a two-terminal bidirectional device. TVS thyristor 411 remains turned off while the voltage across the TVS thyristor 411 terminals is less than the breakover voltage of TVS thyristor 411. TVS thyristor 411 is turned on when the applied voltage increases to the breakover voltage. TVS thyristor 411 remains turned on as long as its conduction current is greater than the TVS thyristor 411 holding current point, and then turns off when the current decreases below the holding current point.

With continuing reference to FIG. 4A, while TVS thyristor 411 is turned off, TVS thyristor 411 blocks a portion of a voltage across voltage clamping circuit 406, causing MOV 407 to have lower leakage current compared to a voltage clamping circuit that does not include an auxiliary semiconductor device such as TVS thyristor 411. During a fault condition, fault current flowing through capacitor 409 will charge a parasitic capacitor of TVS thyristor 411, increasing its voltage. When the voltage of TVS thyristor 411 reaches the breakover voltage, TVS thyristor 411 is turned on. The turn-on of TVS thyristor 411 may take a few microseconds (2-3 μs) due to the device interior carrier modulation buildup. Capacitor 409 is structured to turn on TVS thyristor 411 and absorb the voltage spike generated during the turn-on of TVS thyristor 411. Since the voltage across TVS thyristor 411 is only a few volts when turned on, the total clamping voltage of voltage clamping circuit 406 is substantially determined by the clamping voltage of MOV 407. When the fault current decreases below the holding current point of TVS thyristor 411, TVS thyristor 411 will turn off and share part of the blocking voltage with MOV 407.

With reference to FIGS. 5A-B, there are graphs illustrating electrical characteristics of two solid state circuit breakers during a fault condition. FIG. 5A illustrates voltage and current wave forms of a voltage clamping circuit including a series coupled MOV and TVS thyristor without a bypass circuit coupled in parallel with the MOV. FIG. 5B illustrates voltage and current wave forms of voltage clamping circuit 406 in FIG. 4A. FIG. 5A includes a voltage waveform graph 510 and a current waveform graph 520. Graph 510 includes lines representing total voltage 511 across an MOV and a TVS thyristor, voltage 513 across the MOV, and voltage 515 across the TVS thyristor. Graph 520 includes lines representing total fault current 521 flowing through the SSCB before the MOV voltage reaches the clamping voltage and a clamping current 523 flowing through the MOV. FIG. 5B includes a voltage waveform graph 530 and a current waveform graph 540. Graph 530 includes lines representing total voltage 531 across MOV 407 and thyristor 411, voltage 533 across MOV 407, and voltage 535 across thyristor 411. Graph 540 includes lines representing total fault current 541 flowing through SSCB 400 before fault current through capacitor 409 reaches total fault current, a clamping current 543 flowing through MOV 407, and a fault current 545 flowing through capacitor 409.

As shown in FIG. 5A, the voltage spike generated by turning on the TVS thyristor occurs at the same time as the MOV voltage reaching the MOV clamping voltage, causing the total clamping voltage to equal the sum of the MOV clamping voltage and the TVS thyristor breakover voltage. By contrast, the graphs of shown in FIG. 5B illustrate the reduced total clamping voltage of the exemplary voltage clamping circuit including the bypass circuit. With capacitor 409 in parallel with MOV 407, the MOV voltage is limited by the capacitor during the turn on of TVS thyristor 411. Therefore, the combination of the TVS thyristor 411 voltage spike and the MOV 407 voltage never exceeds the MOV 407 clamping voltage.

Figures 6A, 6B:
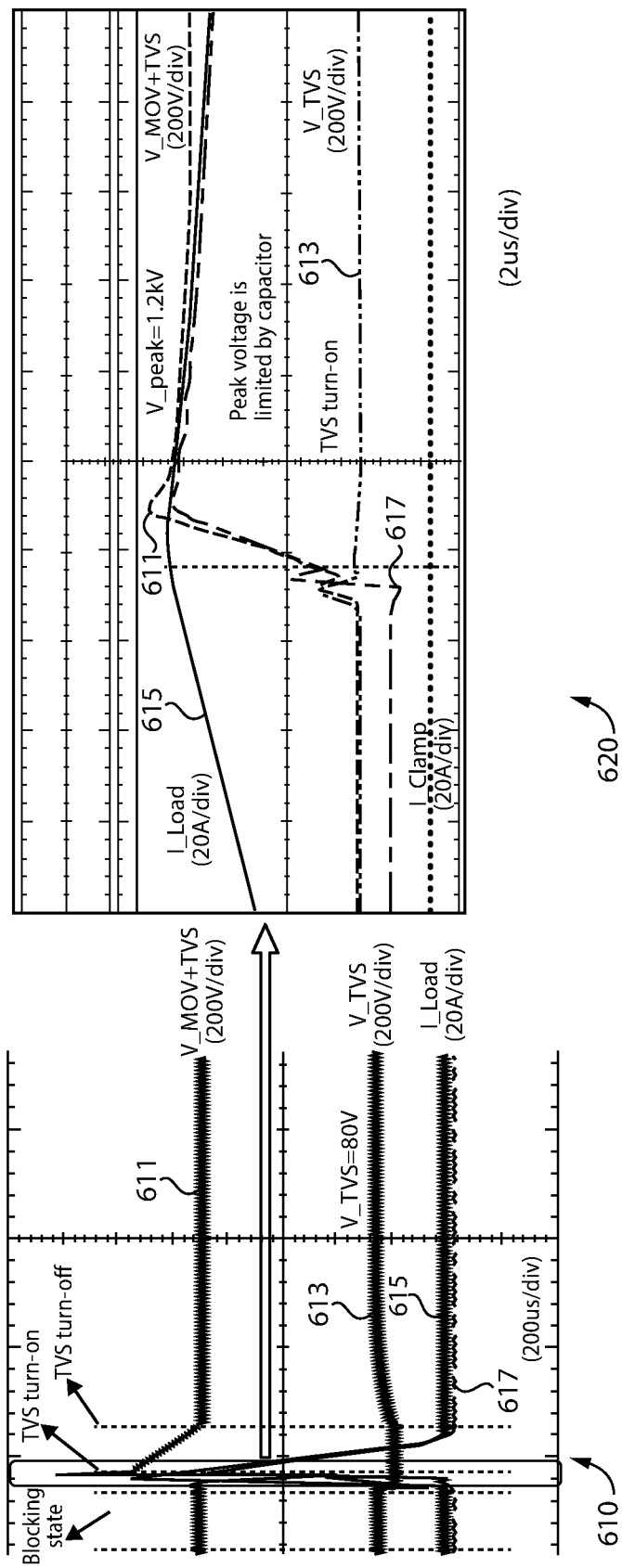

With reference to FIGS. 6A and 6B, there are graphs 610 and 620 illustrating experimental results of SSCB 400 in FIG. 4 at 700V source voltage and 130 A current interruption. Graphs 610 and 620 each include a line 611 representing the total voltage across MOV 407 and TVS thyristor 411; a line 613 representing the voltage across TVS thyristor 411; a line 615 representing the load current; and a line 617 representing the current flowing through voltage clamping circuit 406. In FIG. 6A, it can be found that during a blocking state, TVS thyristor 411 shares part of the voltage (about 80V) with MOV 407. When primary switching device 405 is turned off at 130A load current, the current commutates from device 405 to voltage clamping circuit 406, charging up the voltage across TVS thyristor 411, as shown in FIG. 6B. When TVS thyristor 411 voltage reaches the breakover voltage, it is turned on and its voltage drops to on state voltage. During this period, the MOV 407 voltage is limited by capacitor 409 and the clamping circuit voltage is slightly higher than the TVS thyristor 411 breakover voltage. After the TVS thyristor 411 is turned on, the clamping circuit voltage is determined only by MOV 407. As shown in FIG. 6A, when the fault current drops below the hold current point of TVS thyristor 411, TVS thyristor 411 is turned off again and starts to block the voltage.

Figure 7:
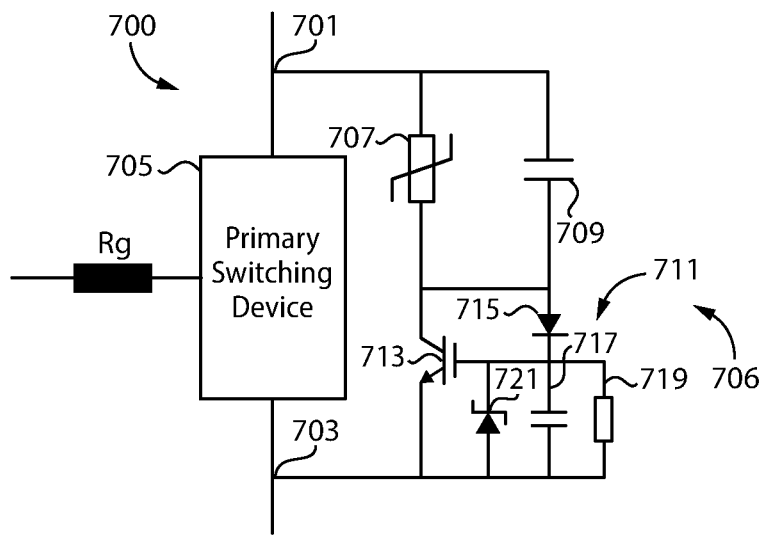
FIG. 7 is a circuit diagram illustrating an exemplary solid state circuit breaker including an insulated-gate bipolar transistor (IGBT)-based voltage clamping circuit.

With reference to FIG. 7, there is illustrated an exemplary SSCB 700 including a primary switching device 705 and a voltage clamping circuit 706 coupled in parallel. Primary switching device 705 includes terminals 701 and 703. Voltage clamping circuit 706 includes an MOV 707, a bypass circuit 709, and an auxiliary semiconductor device 711. Bypass circuit 709 includes a capacitor structured to turn on auxiliary semiconductor device 711. Auxiliary semiconductor device 711 includes an IGBT 713 coupled between MOV 707 and terminal 703, and a control circuit structured to operate IGBT 713 using fault current received from bypass circuit 709. The control circuit includes a diode 715 coupled to bypass circuit 709 and a gate of IGBT 713. The control circuit also includes a Zener diode 721, a gate capacitor 717, and a resistor 719 all coupled in parallel between the gate of IGBT 713 and terminal 703.

During a fault condition, fault current flows through bypass circuit 709 and gate capacitor 717 first. Once the gate voltage of IGBT 713 exceeds a gate threshold voltage, IGBT 713 is turned on and the fault current flows through bypass circuit 709 and IGBT 713. When the voltage of bypass circuit 709 rises to the clamping voltage of MOV 707, the fault current commutates from bypass circuit 709 to MOV 707. As MOV 707 absorbs the fault current, resistor 719 is structured to discharge gate capacitor 717. Once the voltage across gate capacitor 717 decreases below the gate threshold voltage, IGBT 713 is turned off.

Figure 8:
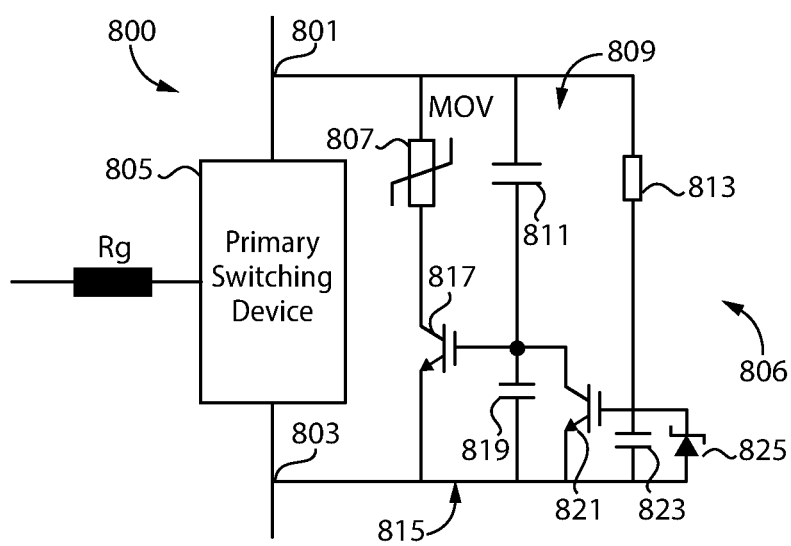
FIG. 8 is a circuit diagram illustrating an exemplary solid state circuit breaker including another IGBT-based voltage clamping circuit.

With reference to FIG. 8, there is illustrated an exemplary SSCB 800 including a primary switching device 805 and a voltage clamping circuit 806 coupled in parallel. Primary switching device 805 includes terminals 801 and 803. Voltage clamping circuit 806 includes an MOV 807, a bypass circuit 809, and an auxiliary semiconductor device 815.

Bypass circuit 809 includes a capacitor 811 and a resistor 813 coupled to terminal 801. Capacitor 811 is structured to provide fault current to auxiliary semiconductor device 815 effective to turn on auxiliary semiconductor device 815. Resistor 813 is structured to provide fault current to auxiliary semiconductor device 815 effective to turn off auxiliary semiconductor device 815.

Auxiliary semiconductor device 815 includes an IGBT 817 coupled between MOV 807 and terminal 803, and a control circuit structured to operate IGBT 817 using fault current received from bypass circuit 809. The control circuit includes a gate capacitor 819 coupled between capacitor 811 and terminal 803. A gate of IGBT 817 is coupled to capacitor 811 and gate capacitor 819. The control circuit also includes an IGBT 821 coupled in parallel with gate capacitor 819, a gate capacitor 823 coupled between resistor 813 and terminal 803, and a Zener diode coupled in parallel with gate capacitor 823. A gate of IGBT 821 is coupled to resistor 813 and gate capacitor 823.

During a fault condition, the fault current flows through capacitor 811 and gate capacitor 819. Once a gate voltage of IGBT 817 exceeds a gate voltage threshold, IGBT 817 is turned on and the fault current commutates from bypass circuit 809 to MOV 807. As MOV 807 absorbs the fault current, a portion of the fault current flows through resistor 813 and gate capacitor 823. When a gate voltage of IGBT 821 exceeds a gate voltage threshold, IGBT 821 is turned on. In response to IGBT 821 being turned on, the gate voltage of IGBT 817 decreases below the gate threshold, turning off IGBT 817. The capacitances of capacitors 811, 819, and 823, as well as the resistance value of resistor 813, are sized so that IGBT 817 is turned on in response to voltage clamping circuit 806 receiving a fault current and turned off when the fault current decreases to zero.

Further written description of a number of exemplary embodiments shall now be provided. One embodiment is a solid state circuit breaker (SSCB) comprising: a primary switching device including a first terminal and a second terminal; and a voltage clamping circuit coupled in parallel with the primary switching device including: a metal-oxide varistor (MOV) coupled in series between the first terminal and an auxiliary semiconductor device, the auxiliary semiconductor device being arranged so as to selectively couple the MOV with the second terminal, and a bypass circuit coupled between the first terminal and the auxiliary semiconductor device.

In certain forms of the foregoing SSCB, the voltage clamping circuit is structured to receive a fault current after the primary switching device is opened, and wherein the auxiliary semiconductor device is structured to turn on in response to receiving the fault current by way of the bypass circuit. In certain forms, the fault current commutates from the bypass circuit to the MOV in response to the auxiliary semiconductor device being turned on. In certain forms, turning on the auxiliary semiconductor device generates a voltage spike across the auxiliary semiconductor device before the auxiliary semiconductor device is turned on, wherein an MOV voltage increases to an MOV clamping voltage after the auxiliary semiconductor device is turned on, and wherein the voltage clamping circuit is structured such that a combination of the voltage spike and the MOV voltage never exceeds the MOV clamping voltage. In certain forms, the bypass circuit is structured to allow a fault current to flow to the auxiliary semiconductor device from the first terminal without flowing through the MOV effective to turn on the auxiliary semiconductor device before the MOV voltage increases to an MOV clamping voltage. In certain forms, the voltage clamping circuit is structured such that a total clamping voltage across the voltage clamping circuit does not exceed an MOV clamping voltage. In certain forms, the auxiliary semiconductor device includes a transient voltage suppression (TVS) thyristor or a TVS diode coupled between the MOV and the second terminal, and wherein the bypass circuit includes a capacitor coupled in parallel with the MOV. In certain forms, the auxiliary semiconductor device includes a switching device and a control circuit, wherein the switching device and the control circuit are coupled to the bypass circuit. In certain forms, the bypass circuit includes a capacitor coupled to the control circuit and coupled in parallel with the MOV. In certain forms, the bypass circuit includes a capacitor coupled to the switching device and the control circuit, and a resistor coupled to the control circuit.

Another exemplary embodiment is a method for protecting a primary switching device of a solid state circuit breaker (SSCB), the primary switching device comprising: coupling a voltage clamping circuit in parallel with the primary switching device, the voltage clamping circuit including a metal-oxide varistor (MOV), an auxiliary semiconductor device, and a bypass circuit; receiving, with the auxiliary semiconductor device by way of the bypass circuit, a fault current after the primary switching device is turned off; turning on the auxiliary semiconductor device using the fault current; and commutating the fault current from the bypass circuit to the MOV in response to the auxiliary semiconductor device being turned on.

In certain forms of the foregoing method, the MOV is coupled in parallel with the bypass circuit, and wherein the MOV is coupled in series with a switching device of the auxiliary semiconductor device. In certain forms, the fault current commutating from the bypass circuit to the MOV begins after a switching device of the auxiliary semiconductor device coupled to the MOV closes and ends when an MOV voltage increases to an MOV clamping voltage. In certain forms, turning on the auxiliary semiconductor device generates a voltage spike across the auxiliary semiconductor device, wherein an MOV voltage of the MOV increases to an MOV clamping voltage after the auxiliary semiconductor device is turned on, and wherein the voltage clamping circuit is structured such that a combination of the voltage spike and the MOV voltage never exceeds the MOV clamping voltage. In certain forms, the bypass circuit allows the fault current to flow to the auxiliary semiconductor device from a first terminal of the SSCB without flowing through the MOV effective to turn on the auxiliary semiconductor device before the MOV voltage reaches an MOV clamping voltage. In certain forms, the voltage clamping circuit is structured such that a total clamping voltage across the voltage clamping circuit does not exceed an MOV clamping voltage of the MOV. In certain forms, the auxiliary semiconductor device includes a transient voltage suppression (TVS) thyristor or a TVS diode coupled in series with the MOV, and wherein the bypass circuit includes a capacitor coupled in parallel with the MOV. In certain forms, the auxiliary semiconductor device includes a switching device and a control circuit, and wherein the switching device and the control circuit are coupled to the bypass circuit. In certain forms, the bypass circuit includes a capacitor coupled to the control circuit and coupled in parallel with the MOV. In certain forms, the bypass circuit includes a capacitor coupled to the switching device and the control circuit, and a resistor coupled to the control circuit.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred" or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection to, another item, as well as a belonging to, or a connection with, the other item as informed by the context in which it is used. The terms "coupled to," "coupled with" and the like include indirect connection and coupling, and further include but do not require a direct coupling or connection unless expressly indicated to the contrary. When the language "at least a portion" and/or "a portion" is used, the item can include a portion and/or the entire item unless specifically stated to the contrary.

What is claimed is:

1. A solid state circuit breaker (SSCB) comprising:
a primary switching device including a first terminal and a second terminal; and
a voltage clamping circuit coupled in parallel with the primary switching device including:
a metal-oxide varistor (MOV) coupled in series between the first terminal and an auxiliary semiconductor device, the auxiliary semiconductor device being arranged so as to selectively couple the MOV with the second terminal, and
a bypass circuit coupled between the first terminal and the auxiliary semiconductor device,
wherein the auxiliary semiconductor device is structured to turn on in response to receiving a fault current by way of the bypass circuit.

2. The SSCB of claim 1, wherein the voltage clamping circuit is structured to receive the fault current after the primary switching device is opened.

3. The SSCB of claim 2 and wherein the fault current commutates from the bypass circuit to the MOV in response to the auxiliary semiconductor device being turned on.

4. The SSCB of claim 3, wherein turning on the auxiliary semiconductor device generates a voltage spike across the auxiliary semiconductor device before the auxiliary semiconductor device is turned on, wherein an MOV voltage increases to an MOV clamping voltage after the auxiliary semiconductor device is turned on, and wherein the voltage clamping circuit is structured such that a combination of the voltage spike and the MOV voltage never exceeds the MOV clamping voltage.

5. The SSCB of claim 1, wherein the bypass circuit is structured to allow a fault current to flow to the auxiliary semiconductor device from the first terminal without flowing through the MOV effective to turn on the auxiliary semiconductor device before a MOV voltage increases to a MOV clamping voltage.

6. The SSCB of claim 1, wherein the voltage clamping circuit is structured such that a total clamping voltage across the voltage clamping circuit does not exceed an MOV clamping voltage.

7. The SSCB of claim 1, wherein the auxiliary semiconductor device includes a transient voltage suppression (TVS) thyristor or a TVS diode coupled between the MOV and the second terminal, and wherein the bypass circuit includes a capacitor coupled in parallel with the MOV.

8. A solid state circuit breaker (SSCB) comprising:
a primary switching device including a first terminal and a second terminal; and
a voltage clamping circuit coupled in parallel with the primary switching device including:
a metal-oxide varistor (MOV) coupled in series between the first terminal and an auxiliary semiconductor device, the auxiliary semiconductor device being arranged so as to selectively couple the MOV with the second terminal, and
a bypass circuit coupled between the first terminal and the auxiliary semiconductor device,
wherein the auxiliary semiconductor device includes a switching device and a control circuit, wherein the switching device and the control circuit are coupled to the bypass circuit.

9. The SSCB of claim 8, wherein the bypass circuit includes a capacitor coupled to the control circuit and coupled in parallel with the MOV.

10. The SSCB of claim 8 wherein the bypass circuit includes a capacitor coupled to the switching device and the control circuit, and a resistor coupled to the control circuit.

11. A method for protecting a primary switching device of a solid state circuit breaker (SSCB), the method comprising:
coupling a voltage clamping circuit in parallel with the primary switching device, the voltage clamping circuit including a metal-oxide varistor (MOV), an auxiliary semiconductor device, and a bypass circuit;
receiving, with the auxiliary semiconductor device by way of the bypass circuit, a fault current after the primary switching device is turned off;
turning on the auxiliary semiconductor device using the fault current; and
commutating the fault current from the bypass circuit to the MOV in response to the auxiliary semiconductor device being turned on.

12. The method of claim 11, wherein the MOV is coupled in parallel with the bypass circuit, and wherein the MOV is coupled in series with a switching device of the auxiliary semiconductor device.

13. The method of claim 12 and wherein the fault current commutating from the bypass circuit to the MOV begins after a switching device of the auxiliary semiconductor device coupled to the MOV closes and ends when an MOV voltage increases to an MOV clamping voltage.

14. The method of claim 11, wherein turning on the auxiliary semiconductor device generates a voltage spike across the auxiliary semiconductor device, wherein an MOV voltage of the MOV increases to an MOV clamping voltage after the auxiliary semiconductor device is turned on, and wherein the voltage clamping circuit is structured such that a combination of the voltage spike and the MOV voltage never exceeds the MOV clamping voltage.

15. The method of claim 11, wherein the bypass circuit allows the fault current to flow to the auxiliary semiconductor device from a first terminal of the SSCB without flowing through the MOV effective to turn on the auxiliary semiconductor device before a MOV voltage reaches an MOV clamping voltage.

16. The method of claim 11, wherein the voltage clamping circuit is structured such that a total clamping voltage across the voltage clamping circuit does not exceed an MOV clamping voltage of the MOV.

17. The method of claim 11, wherein the auxiliary semiconductor device includes a transient voltage suppression (TVS) thyristor or a TVS diode coupled in series with the MOV, and wherein the bypass circuit includes a capacitor coupled in parallel with the MOV.

18. The method of claim 11, wherein the auxiliary semiconductor device includes a switching device and a control circuit, and wherein the switching device and the control circuit are coupled to the bypass circuit.

19. The method of claim 18, wherein the bypass circuit includes a capacitor coupled to the control circuit and coupled in parallel with the MOV.

20. The method of claim 18 wherein the bypass circuit includes a capacitor coupled to the switching device and the control circuit, and a resistor coupled to the control circuit.

* * * * *